United States Patent
Mok et al.

(10) Patent No.: US 9,420,684 B2
(45) Date of Patent: Aug. 16, 2016

(54) APPARATUS FOR BLANKING A PRINTED CIRCUIT FILM

(71) Applicant: SAMSUNG DISPLAY CO., LTD, Yongin, Gyeonggi-Do (KR)

(72) Inventors: JiHoon Mok, Cheonan-si (KR); Minill Kim, Cheonan-si (KR); Sangmyung Byun, Asan-si (KR); Youngil Kim, Gwacheon-si (KR); Tackkeun Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 420 days.

(21) Appl. No.: 13/644,883

(22) Filed: Oct. 4, 2012

(65) Prior Publication Data

US 2013/0081268 A1    Apr. 4, 2013

(30) Foreign Application Priority Data

Oct. 4, 2011    (KR) .......................... 10-2011-0100769

(51) Int. Cl.
*B23P 21/00*    (2006.01)
*B23Q 15/00*    (2006.01)
*H05K 1/02*    (2006.01)
*H05K 3/00*    (2006.01)

(52) U.S. Cl.
CPC ............ *H05K 1/0266* (2013.01); *H05K 3/0052* (2013.01); *H05K 3/0008* (2013.01); *H05K 2203/1545* (2013.01); *H05K 2203/167* (2013.01); *Y10T 29/49155* (2015.01); *Y10T 29/5193* (2015.01)

(58) Field of Classification Search
USPC ........... 29/33 M, 721, 759, 760, 762; 72/368; 251/129.01, 129.15, 366; 83/29, 35, 83/36, 50; 335/278

See application file for complete search history.

(56) References Cited

U.S. PATENT DOCUMENTS

| | | | | |
|---|---|---|---|---|
| 2,283,629 | A * | 5/1942 | Heftler | 29/433 |
| 3,518,756 | A * | 7/1970 | Boyd et al. | 29/846 |
| 4,285,754 | A * | 8/1981 | DiMatteo | 156/264 |
| 4,704,184 | A * | 11/1987 | Oboshi | 156/512 |
| 5,019,314 | A * | 5/1991 | Burlando | 264/156 |
| 5,413,665 | A * | 5/1995 | Gaetano | 156/514 |
| 6,682,625 | B1 * | 1/2004 | Futamura et al. | 156/252 |
| 2012/0227555 | A1 * | 9/2012 | Kim et al. | 83/55 |

FOREIGN PATENT DOCUMENTS

| | | | |
|---|---|---|---|
| JP | 06268021 | A * | 9/1994 |
| JP | 2000127084 | A | 5/2000 |

(Continued)

*Primary Examiner* — Paul D Kim
(74) *Attorney, Agent, or Firm* — Cantor Colburn LLP

(57) ABSTRACT

An apparatus for blanking a printed circuit film from a base film, including: an insert member on a lower plate, overlapping a hit region of the base film and including a first pin hole aligned with an auxiliary fixing-hole of the base film an upper plate overlapping the lower plate and movable relative to the lower plate; a puncher protruding from the upper plate and contacting the hit region of the base film; and a fixing-pin protruding from the upper plate and inserted in the auxiliary fixing-hole of the base film and into the first pin hole of the insert member. The base film includes a reference fixing-hole being collinear with a center line of the printed circuit film, and a a plurality of auxiliary fixing-holes separated from the reference fixing-holes at equal intervals along a longitudinal direction of the base film.

4 Claims, 12 Drawing Sheets

(56) References Cited

FOREIGN PATENT DOCUMENTS

| JP | 3306996 B2 | 5/2002 |
| KR | 100310708 B1 | 10/2001 |
| KR | 2008053999 A * | 6/2008 |
| KR | 10-2010-0058748 A | 6/2010 |

* cited by examiner

APPARATUS FOR BLANKING A PRINTED CIRCUIT FILM

This application claims priority to Korean Patent Application No. 10-2011-0100769 filed on Oct. 4, 2011, and all the benefits accruing therefrom under 35 U.S.C. §119, the contents of which are herein incorporated by reference in its entirety.

BACKGROUND OF THE INVENTION

1. Field of the Invention

The invention disclosed herein relates to a method for manufacturing a base film including printed circuit films and an apparatus for blanking the printed circuit film.

2. Description of the Related Art

A general liquid crystal display device changes a particular molecule arrangement of liquid crystal into another molecule arrangement by applying a voltage. The general liquid crystal display device transforms the change of optical characteristics such as birefringent characteristic of a liquid crystal cell radiating light, optical activity characteristic, and light scattering characteristic by the molecule arrangement, into visual change. Thus, the general liquid crystal device is a display device which displays information using the above light modulation of the liquid crystal cell. Liquid crystal display devices have been used as all plate display devices such as a mobile phone, a monitor and a television. The liquid crystal display devices being lighter, having higher definition and being slimmer have been produced with rapidly technical development.

In the liquid crystal display device, a flexible printed circuit film electrically connects a liquid crystal display panel to a printed circuit board. An integrated circuit chip may be mounted on the flexible printed circuit film by using a chip on film ("COF") method and a tape carrier package ("TCP") method. The flexible printed circuit film may be manufactured in uniform size by hitting a base film with a puncher.

BRIEF SUMMARY OF THE INVENTION

Exemplary embodiments of the invention provide a base film including printed circuit films and capable of fixing relative locations of fixing-holes and a printed circuit film.

Exemplary embodiments of the invention also provide an apparatus capable of reducing manufacturing cost.

Exemplary embodiments of the invention also provide an apparatus capable of blanking printed circuit films having different sizes from each other.

In a method for manufacturing a base film including a printed circuit film with a tap integrated circuit ("IC") may include: forming reference fixing-holes in the base film at both sides of the printed circuit film, respectively, the reference fixing-holes being collinear with a center line of the printed circuit film; and forming a plurality of auxiliary fixing-holes separated from the reference fixing-holes at equal intervals along a longitudinal direction of the base film. The printed circuit film includes a first side parallel to the longitudinal direction of the base film, a second side parallel to the first side, a third side perpendicular to the first and second sides, and a fourth side parallel to the third side. The center line of the printed circuit film is located at the same distance from the third side and the fourth side.

In some embodiments, the third side may be symmetrical to the fourth side with respect to the reference fixing-hole.

In other embodiments, the printed circuit film may be provided in plural and the plurality of printed circuit films may be arranged in the longitudinal direction of the base film. The reference fixing-holes and the auxiliary fixing-holes may be formed at the both sides of the plurality of printed circuit films.

In still other embodiments, a center line of the tap IC parallel to the third side may be spaced apart from the center line of the printed circuit film by a predetermined distance.

In an apparatus for blanking a printed circuit film having a tap IC from a base film include the printed circuit film may include: a lower plate; an insert member set on a top surface of the lower plate and supporting a hit region of the base film; an upper plate which moves in up and down directions over the lower plate; a puncher installed at the upper plate and hitting the hit region of the base film to blank the printed circuit film; and a fixing-pin inserted in a fixing-hole in the base film and a pin hole in the insert member to fix the base film. The printed circuit film includes a first side parallel to a longitudinal direction of the base film, a second side parallel to the first side, a third side perpendicular to the first and second sides, and a fourth side parallel to the third side. The puncher blanks the printed circuit film along the first to fourth sides. The fixing-hole in the base film includes a reference fixing-hole being collinear with a center line of the printed circuit film which is located at the same distance from the third side and the fourth side, and auxiliary fixing-holes from the reference fixing-holes at equal intervals along the longitudinal direction of the base film. The fixing-pin is inserted in one of the auxiliary fixing-holes.

In some embodiments, an opening in which the puncher is inserted may be in the insert member. The pin hole may be provided in plural and the pin holes may be classified into a plurality of groups. The number of the groups of the pin holes may correspond to the number of vertexes of the opening, and the pin holes included in one of the groups may be located to be adjacent to one of the vertexes of the opening.

In other embodiments, the pin holes included in one of the groups may be arranged in the longitudinal direction of the base film.

In still other embodiments, the apparatus may further include a stripper located between the upper plate and the lower plate, and having an opening in which the puncher is located; and a support column connecting the stripper to the upper plate and supporting the stripper. Pin holes may be in the stripper to correspond to the pin holes formed in the insert member, and the fixing-pin may be able to selectively move in one of the pin holes formed in the stripper.

In yet other embodiments, an opening may be in the lower plate, and the puncher may be located in the opening of the lower plate after the puncher blanks the printed circuit film. Grooves corresponding to locations of the pin holes of the insert member may be in an inner sidewall of the lower plate constituting the opening.

BRIEF DESCRIPTION OF THE DRAWINGS

The invention will become more apparent in view of the attached drawings and accompanying detailed description.

DETAILED DESCRIPTION OF THE INVENTION

Figure 1:
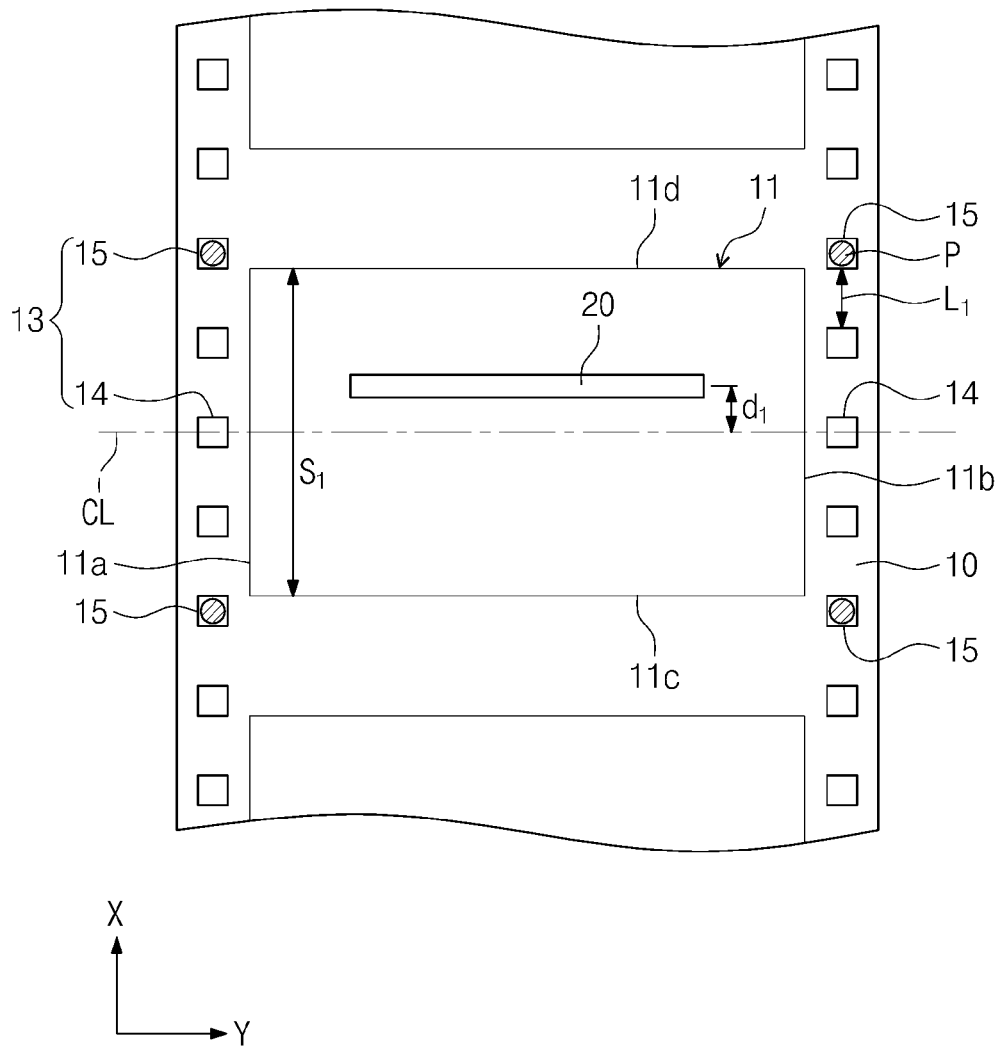
FIGS. 1 and 2 show exemplary embodiments of base films including printed circuit films manufactured by manufacturing methods according to the invention.

The invention will now be described more fully hereinafter with reference to the accompanying drawings, in which exemplary embodiments of the invention are shown. The advantages and features of the invention and methods thereof will be apparent from the following exemplary embodiments that will be described in more detail with reference to the accompanying drawings. It should be noted, however, that the invention is not limited to the following exemplary embodiments, and may be implemented in various forms. Accordingly, the exemplary embodiments are provided only to disclose the invention and let those skilled in the art know the category of the invention. In the drawings, embodiments of the invention are not limited to the specific examples provided herein and are exaggerated for clarity.

It will be understood that when an element or layer is referred to as being "on" or "connected to" another element or layer, the element or layer can be directly on or connected to another element or layer or intervening elements or layers.

In contrast, when an element is referred to as being "directly on" or "directly coupled to" another element or layer, there are no intervening elements or layers present. As used herein, "connected" includes physically and/or electrically connected. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "lower" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
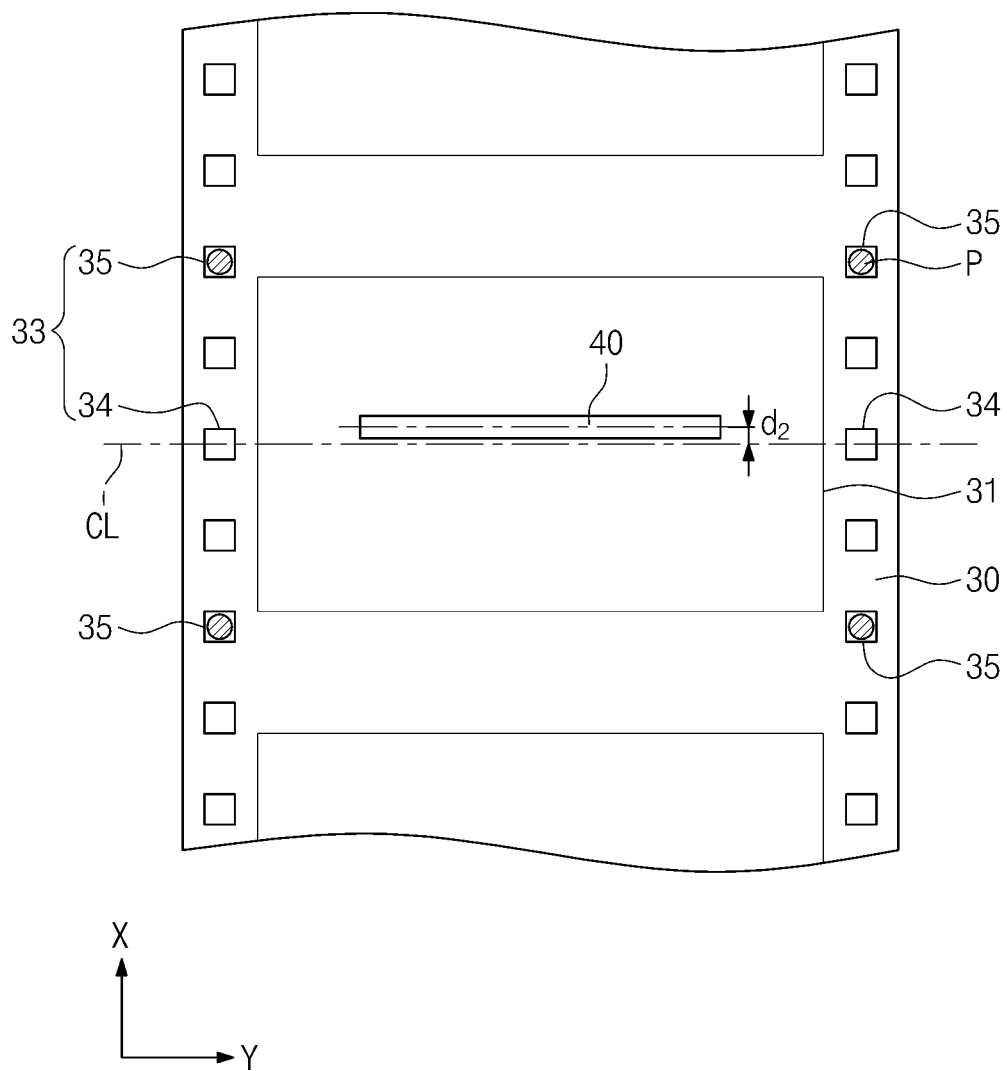

FIGS. 1 and 2 show exemplary embodiments of base films including printed circuit films manufactured by manufacturing methods according to the invention.

Referring to FIG. 1, a printed circuit film 11 is formed on a base film 10 including the printed circuit film (hereinafter, referred to as 'the base film'). A plurality of printed circuits films 11 are on the base film 10 and are spaced apart from each other in a longitudinal direction of the base film 10. Hereinafter, a direction parallel to the longitudinal direction of the base film 10 is referred to as 'a first direction X', and a direction perpendicular to the first direction X in a plan view is referred to as 'a second direction Y'.

The printed circuit film 11 generally has a rectangular shape. The printed circuit film 11 has first, second, third, and fourth sides 11a, 11b, 11c, and 11d. The first side 11a is disposed to be parallel to the first direction X, and the second side 11b is spaced apart from the first side 11a and parallel to the first side 11a. The third side 11c is parallel to the second direction Y and perpendicular to the first and second sides 11a and 11b. The fourth side 11d is spaced apart from the third side 11c and parallel to the third side 11c. The printed circuit film 11 is blanked and separated from the base film 10 along the first to fourth sides 11a to 11d. A center line CL of the printed circuit film 11 is parallel to the third and fourth sides 11c and 11d. The center line CL of the printed circuit film 11 is located at the same distance from the third and fourth sides 11c and 11d.

A plurality of fixing-holes 13 is in the base film 10 at both of opposing sides of the printed circuit film 11 and spaced apart from each other at a predetermined interval in the first direction X. The fixing holes 13 may extend completely or partially through a thickness of the base film, in a third direction orthogonal to both the first direction X and the second direction Y. The fixing-holes 13 at one side of the printed circuit film 11 are symmetrical to the fixing-holes 13 at the opposing side of the printed circuit film 11, with respect to the printed circuit film 11.

The fixing-holes 13 include reference fixing-holes 14 and auxiliary fixing-holes 15. The reference fixing-holes 14 are disposed at both sides of the printed circuit film 11, respectively, and the reference fixing-holes 14 are collinear with the center line CL of the printed circuit film 11. The third side 11c is symmetrical to the fourth side 11d with respect to the reference fixing-holes 14. The auxiliary fixing-holes 15 are spaced apart from the reference fixing-holes 14 at equal intervals in the first direction X. Fixing-pins P are inserted in some of the auxiliary fixing-holes 15. The fixing-pins P may fix the base film 10 in a process of blanking the printed circuit film 11.

A tap integrated circuit ("IC") 20 is mounted on the printed circuit film 11. The tap IC 20 receives a signal from the outside to output a driving signal. The location of the tap IC 20 may be changed in a process when connected to interconnections within the printed circuit film 11. A center line of the tap IC 20 or 40 in FIG. 2 may be spaced apart from the center line CL of the printed circuit film 11 or 31 of FIG. 2 by a predetermined distance. In the exemplary embodiment, for example, as shown in FIG. 1, the center line of the tap IC 20 may be located at a first distance dl from the center line CL of the printed circuit film 11. Alternatively, as shown in FIG. 2, the center line of the tap IC 40 may be located at a second distance d2 from the center line CL of the printed circuit film 31. In a base film 30 of FIG. 2, reference fixing-holes 34 are collinear with the center line CL of the printed circuit film 31 parallel to the second direction Y. Auxiliary fixing-holes 35 are spaced apart from the reference fixing-hole 34 at equal intervals in the first direction X.

Fixing-holes 13 and 33 of base films 10 and 30 of FIGS. 1 and 2 are formed using the center lines CL of the printed circuit film 11 and 31 as reference positions. Thus, even though locations of the tap IC 20 and 40 are changed, the fixing-pins P may be inserted in the same auxiliary fixing-holes 15 and 35 of the fixing-holes 13 and 33.

Differently from FIGS. 1 and 2, if the auxiliary fixing-holes 15 and 35 are formed using the tap ICs 20 and 40 as the reference positions, a problem that the fixing-pins P must be moved with respect to the provided base films 10 and 30 may occur. In conventional base films, for example, as shown in FIGS. 3 and 4, if reference fixing-holes 54 and 74 are collinear with center lines CL1 and CL2 of tap ICs 60 and 80, respectively, relative locations of the center lines CL of printed circuit films 51 and 71 and auxiliary fixing-holes 55 and 75 are changed according to locations of the tap ICs 60 and 80, respectively.

Figure 3:
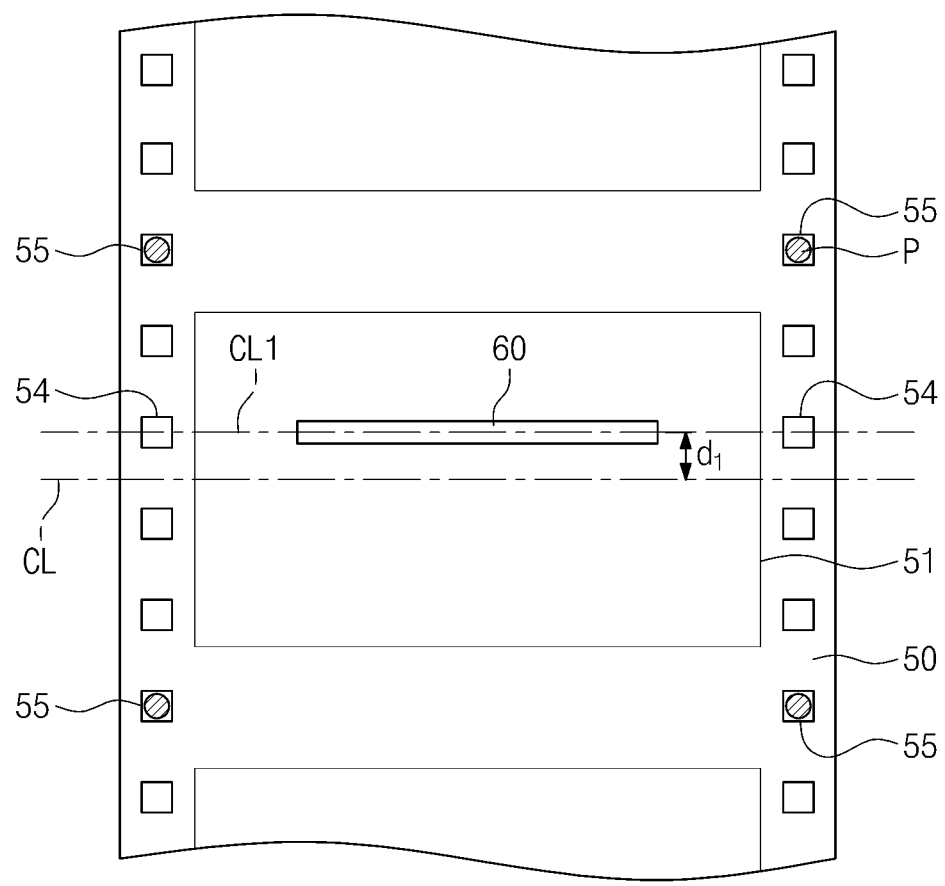
FIGS. 3 and 4 show conventional base films including printed circuit films.
Figure 4:
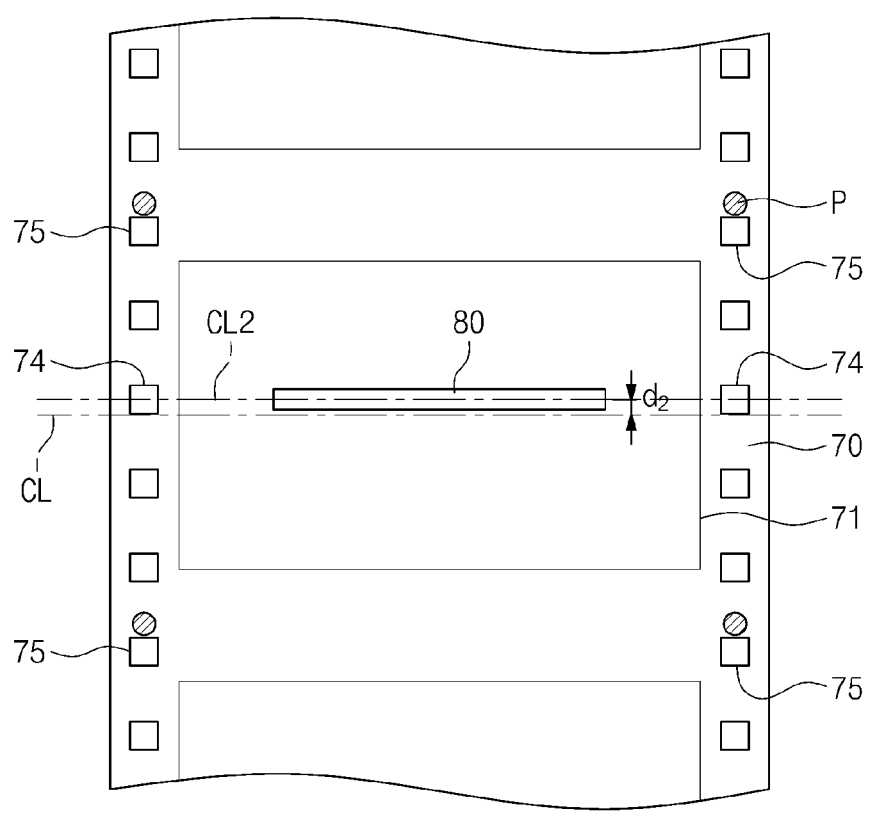

If the center line CL1 of the tap IC 60 located at a first distance dl from the center line CL of the printed circuit film 51 as shown in FIG. 3, is moved to the center line CL2 of the tap IC 80 located at a second distance d2 from the center line CL of the printed circuit film 71 as shown in FIG. 4, a relative location of the auxiliary fixing-hole 55 with respect to the center line CL of the printed circuit film 51 is changed into a relative location of the auxiliary fixing-hole 75 with respect to the center line CL of the printed circuit film 71 by a location change amount defined between locations of the tap IC 60 and 80 with respect to the center lines CL of the printed circuit films 51 and 71. Thus, fixing-pins P inserted in the auxiliary fixing-holes 55 of FIG. 3 cannot be inserted in the auxiliary fixing-holes 75 of FIG. 4, and a surface of the base film 70 is damaged.

On the contrary, in exemplary embodiments according to the invention, since the fixing-holes 13 and 33 of base films 10 and 30 illustrated in FIGS. 1 and 2 are formed using the center lines CL of the printed circuit films 11 and 31 as the reference positions, even though the locations of tap IC 20 and 40 are changed, the fixing-pins P are consistently inserted in the auxiliary fixing-holes 15 and 35 to fix the base films 10 and 30, respectively.

Figure 5:
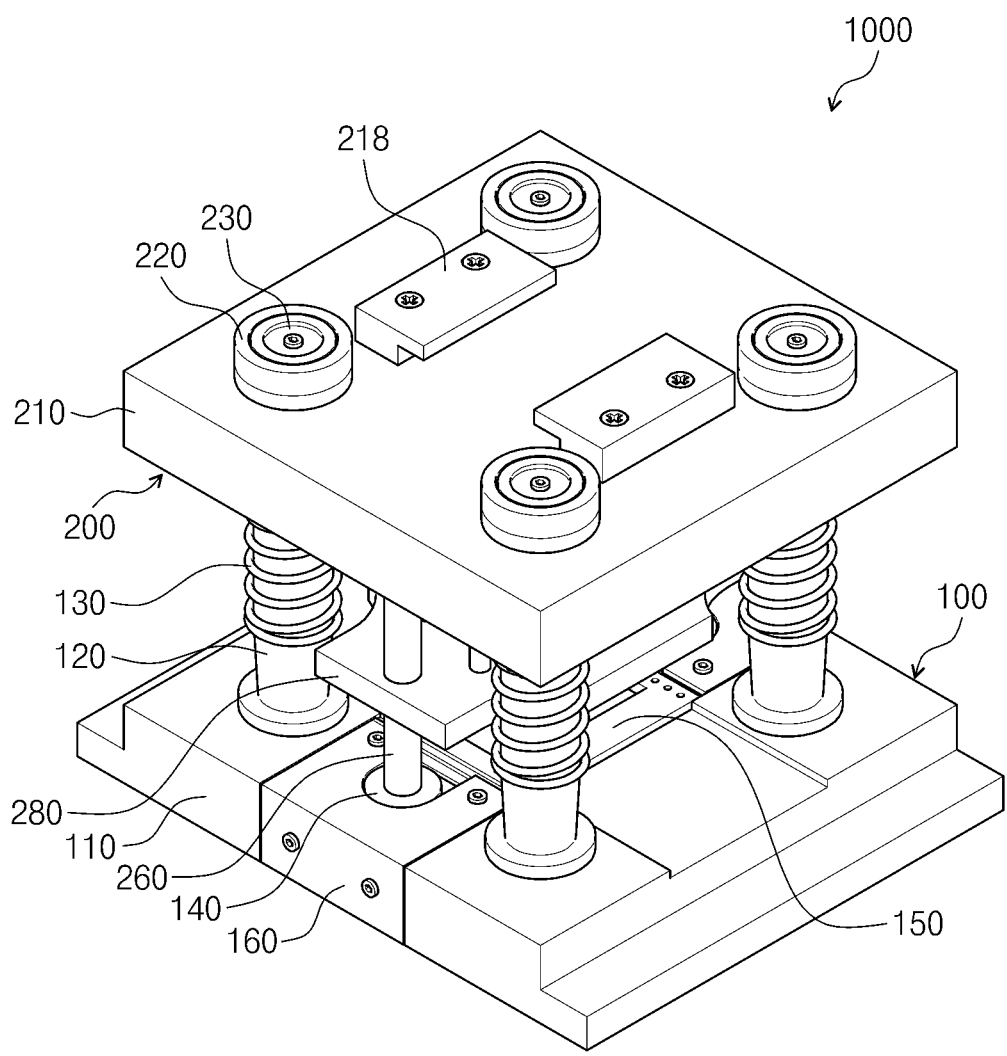
FIG. 5 is a perspective view showing an exemplary embodiment of a printed circuit board blanking apparatus according to the invention.
Figure 6:
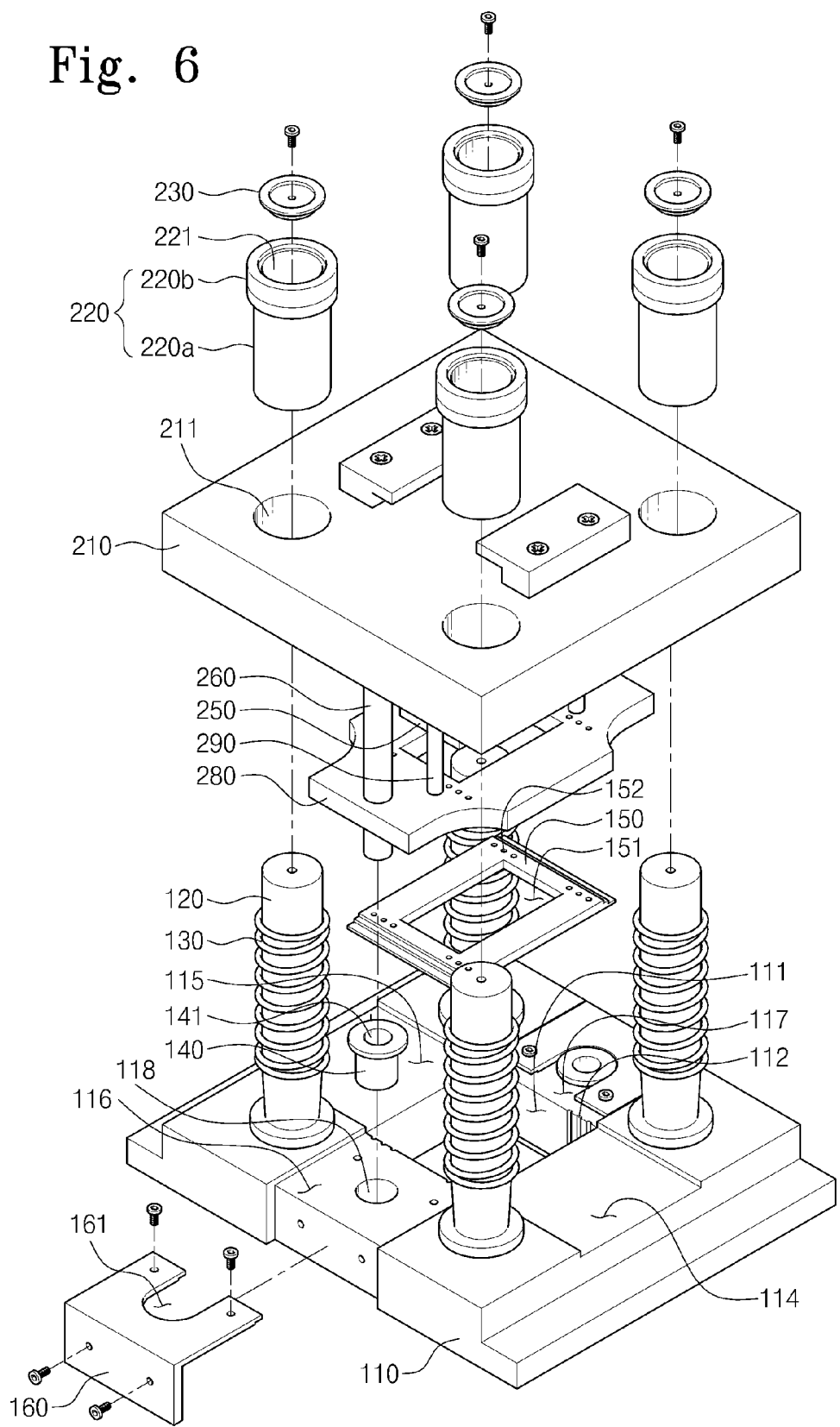
FIG. 6 is a exploded perspective view showing the printed circuit board blanking apparatus of FIG. 5.
Figure 7:
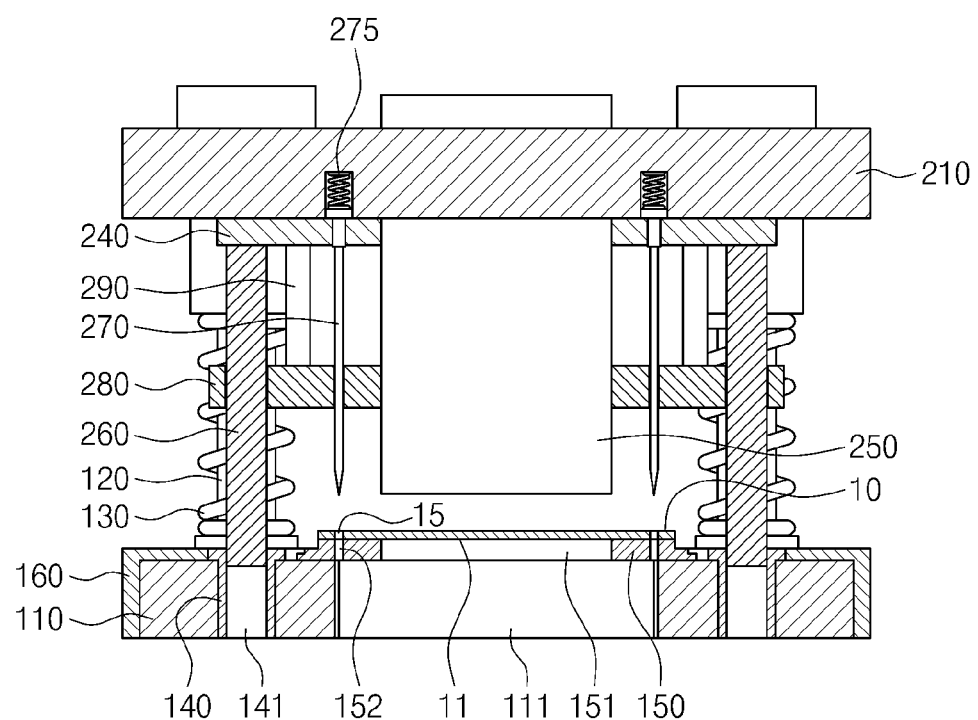
FIG. 7 is a cross-sectional view showing the printed circuit board blanking apparatus of FIG. 5.

FIG. 5 is a perspective view showing an exemplary embodiment of a printed circuit board blanking apparatus according to the invention, FIG. 6 is an exploded perspective view showing the printed circuit board blanking apparatus of FIG. 5, and FIG. 7 is a cross-sectional view showing the printed circuit board blanking apparatus of FIG. 5.

Referring to FIGS. 5 to 7, a printed circuit film blanking apparatus 1000 hits and contacts the base film 10 or 30 shown in FIG. 1 or 2 to blank the printed circuit film 11 or 31. The printed circuit film blanking apparatus 1000 includes a die unit 100 and a punch unit 200. The die unit 100 supports a hit region of the base film 10 and the punch unit 200 contacts the hit region of the base film 10 supported by the die unit 100 to blank the printed circuit film 11. Hereinafter, components of the printed circuit film blanking apparatus 1000 will be described in more detail.

The die unit 100 includes a lower plate 110, an elevation column 120, an elastic member 130, a guide bush 140, an insert member 150 and an insert fixing part 160.

The lower plate 110 has a rectangular shape. A first opening 111 is in a center region of the lower plate 110. The first opening 111 is a through hole extending from a top surface of the lower plate 110 to a bottom surface of the lower plate 110. The first opening 111 has a substantially rectangular shape in the plan view. The first opening 111 is a space where the printed circuit film 11 of FIG. 1 is inserted after a puncher 250 blanks the printed circuit film 11. A groove part 112 is on an inner sidewall defining the first opening 111 of the lower plate 110. The groove part 112 is parallel to an up-to-down direction (e.g., the third direction) from the top surface to the bottom surface of the lower plate 110. The groove part 112 may include a groove provided in plural. The grooves of groove part 112 correspond to locations and the number of pin holes 152 of the insert member 150. The grooves of the groove part 112 guide a descent of a fixing-pin 270 sequentially passing through the auxiliary fixing-hole 15 of the base film 10 and the pin-hole 152 of the insert member 150.

Guide grooves 114 and 115 and insertion grooves 116 and 117 are recesses extending inward from the top surface of the lower plate 110. The guide grooves 114 and 115 are at both of opposing sides of the first opening 111, respectively. The guide grooves 114 and 115 extend from the first opening 111 to an outer sidewall of the lower plate 110. The guide grooves 114 and 115 guides the supply of the base film 10. The base film 10 provided to a blanking process is located at the guide groove 114 provided at one side of the opening 111. The base film 10 where the blanking process is completed is located at the guide groove 115 provided at the opposite side of the opening 111.

The insertion grooves 116 and 117 are located at both of opposing sides of the first opening 111, respectively. The insertion grooves 116 and 117 and the guide grooves 114 and 115 are disposed in a cross shape with the first opening 111 as a center when viewed from a top view. The insertion grooves 116 and 117 extend from the first opening 111 to the outer sidewall of the lower plate 110. The insert fixing parts 160 are respectively received in the insertion groves 116 and 117 are fixed to the lower plate 110. Bush holes 118 are at bottom surfaces of the insertion grooves 116 and 117, respectively. The bush holes 118 are through holes extending from the bottom surfaces of the insertion grooves 116 and 117 to the bottom surface of the lower plate 110.

The elevation column 120 is located on the lower plate 110 and has a column shape. A length of the elevation column 120 is disposed in the up-to-down direction. A lower portion of the elevation column 120 is fixedly installed on the top surface of the lower plate 110. According to some embodiments, four elevation columns 120 are provided to regions between the insertion grooves 116 and 117 and the guide grooves 114 and 115, respectively. The elevation column 120 guides the punch unit 200 in an up and down direction along a predetermined movement path in a process moving the punch unit 200 along the up and down directions for hitting the base film 10.

The elastic member 130 is mounted on each of the elevation columns 120. The elastic member 130 is compressed in a process hitting the base film 10 by the descent of the punch unit 200 and the elastic member 130 is stretched in a process raising the punch unit 200 to an initial position thereof, after blanking. In some embodiments, a spring may be used as the elastic member 130.

The guide bushes 140 are inserted in the bush holes 118, respectively. An outer surface of the guide bush 140 has the same radius as that of an inner surface of the bush hole 118. A guide hole 141 is in a center region of the guide bush 140. The guide hole 141 is a through hole extending from a top surface of the guide bush 140 to a bottom surface of the guide bush 140. The guide hole 141 of the guide bush 140 has substantially the same radius as that of a guide column 260 described below. The guide column 260 is inserted in the guide hole 141.

Figure 8:
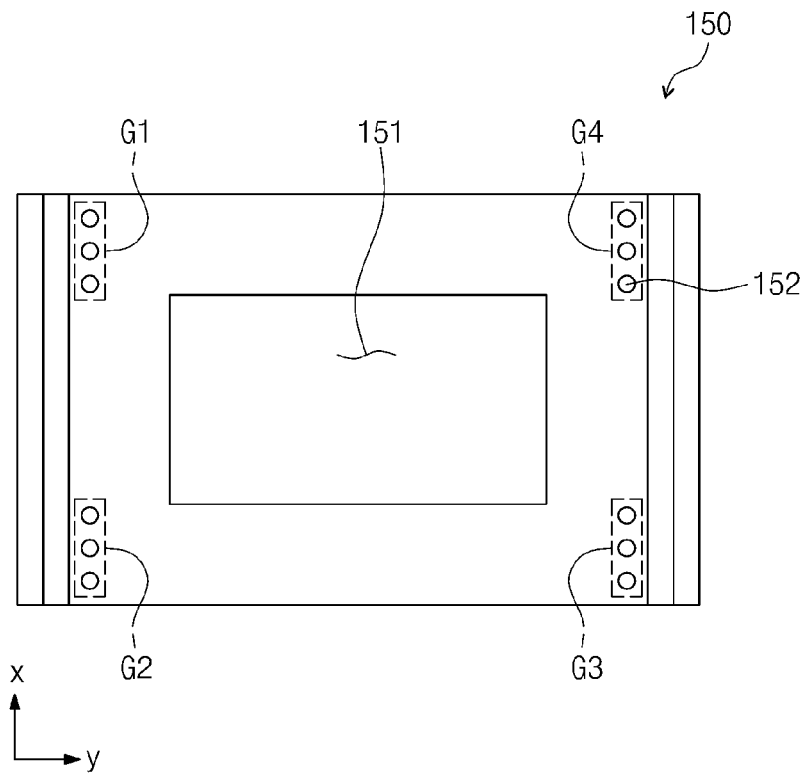
FIG. 8 is a plan view showing an exemplary embodiment of an insert member of FIG. 6.

FIG. 8 is a plan view showing an exemplary embodiment of an insert member of FIG. 6.

Referring to FIGS. 6 and 8, the insert member 150 has a thin rectangular shape and is disposed on a top surface of the lower plate 110. In more detail, a first end of the insert member 150 is disposed on the bottom surface of a first insertion groove 116, and an opposing second end of the insert member 150 is disposed on the bottom surface of a second insertion groove 117. The hit region of the base film 10 is disposed on a top surface of the insert member 150. A second opening 151 and the pin holes 152 are in the insert member 150. The second opening 151 is in a center region of the insert member 150 and is a through hole extending from the top surface of the insert member 150 to the bottom surface of the insert member 150. The second opening 151 is disposed on the first opening 111, such that the first and second openings 111 and 151 are aligned or form a continuous opening in the third direction.

The second opening 151 has a rectangular shape in the plan view and has a planar area corresponding to that of the printed circuit film 11. The puncher 250 hitting the base film 10 is inserted in the second opening 151. The pin holes 152 are in a region of the insert member 150 adjacent to a vertex of the second opening 151. The pin holes 152 are through holes extending from the top surface of the insert member 150 to the bottom surface of the insert member 150, are connected to the grooves of the groove part 112 on the inner sidewall of the first opening 111, such that the pin holes 152 are aligned with the grooves of the groove part 112. The pin holes 152 are classified into a plurality of groups G1 to G4. Each of the groups G1 to G4 includes at least two pin holes 152. Each of the groups G1 to G4 is located to be adjacent to a vertex of the second opening 151. In some embodiments, the pin holes 152 are classified into four groups G1 to G4, and the four groups G1 to G4 are located to be adjacent to the vertexes of the second opening 151 having the rectangular shape, respectively. The pin holes 152 included in each of the groups G1 to G4 are spaced apart from each other in the first direction X. One of the pin holes 152 in each of the groups G1 to G4 is collinear with the auxiliary fixing-hole 15 in the up-to-down direction. The fixing-pin 270 is inserted in the auxiliary fixing-hole 15 and the pin hole 152 which are collinear and aligned with each other.

Referring to FIGS. 5 to 7 again, the insert fixing part 160 is provided in a pair. The insert fixing parts of the pair 160 are respectively located in the insertion grooves 116 and 117, and fix the insert member 150 to the lower plate 110. An end of the insert fixing part 160 presses an end portion of the insert member 150, and fixes the insert member 150 on the lower plate 110. The insert fixing part 160 includes a receiving hole 161. An upper portion of the guide bush 140 received in the bush hole 118 is located in the receiving hole 161. The insert fixing part 160 may be joined with the lower plate 110 by a bolt-joint.

The punch unit 200 movable in up and down directions over the die unit 100. The punch unit 200 hits the base film 10 supported by the insert member 150, to blank the printed circuit film 11. The punch unit 200 includes an upper plate 210, elevation bushes 220, packing parts 230, assistance plates 240, the puncher 250, the guide column 260, the fixing-pin 270, a stripper 280, and support columns 290.

The upper plate 210 has a shape corresponding to the shape of the lower plate 110 and is disposed over the lower plate 110. The upper plate includes insertion holes 211. The insertion holes 211 are through holes extending from a top surface of the upper plate 210 to a bottom surface of the upper plate 210. The upper plate 210 may include four insertion holes 211 spaced apart from each other. Joint plates 218 are provided on a top surface of the upper plate 210. The joint plates 218 are connected to a die unit elevation part (not shown). The die unit 200 is elevated by the driving of the die unit elevation part.

The elevation bushes 220 are inserted in the insertion holes 211. An elevation hole 221 is formed in each of the elevation bushes 220. The elevation hole 221 is a through hole extending from a top surface of the elevation bush 220 to a bottom surface of the elevation bush 220. A radius of the elevation hole 221 has a size corresponding to a radius of an outer surface of the elevation column 120. The elevation column 120 is received in the elevation hole 221, and the elevation bush 220 is moved along the elevation column 120 when the die unit 220 is elevated. The elevation bush 220 has an insertion part 220*a* and a hitch part 220*b*. An outer surface of the insertion part 220*a* has a size corresponding to that of an inner surface of the insertion hole 211. The insertion part 220*a* is inserted in a space between the inner surface of the insertion 211 and the outer surface of the elevation column 120. The hitch part 220*b* is connected to a top end of the insertion part 220*a* and has a radius greater than a radius of the outer surface of the insertion part 220*a*. The hitch part 220*b* prevents the elevation bush 220 from being completely inserted in the insertion hole 211.

The packing part 230 is combined with a top end of the elevation column 120 and fixed thereto. The packing part 230 has a radius greater than that of the elevation hole 221 in the elevation bush 220. The packing part 230 prevents the inserted elevation bush 220 from being separated from the elevation column 120. The packing part 230 is combined with a top end of the elevation column 120 by a bolt-joint.

The assistance plate 240 is at the bottom surface of the upper plate 210 and fixed thereto. The assistance plate 240 supports the puncher 250, the guide column 260 and the fixing-pins 270.

The puncher 250 is disposed under the upper plate 210. A top end of the puncher 250 is joined to the assistance plate 240, and may be attached on the assistance plate 240 and detached from the assistance plate 240. The puncher 250 has a rectangular parallelepiped shape and a bottom surface of the puncher 250 has an area substantially equal to or less than that of the second opening 151 of the insert member 150. In a process that the punch unit 200 descends, the puncher 250 hits the base film 10 and is inserted in the second opening 151 of the insert member 150 to blank the printed circuit film 11.

A longitudinal direction of the fixing-pin 270 is parallel to the up-to-down direction. Four fixing-pins 270 are provided. A distal end portion of the fixing-pin 270 is sequentially inserted in the auxiliary fixing-hole 15 of the base film 10 and the pin hole 152 of the insert member 150 in the processing of hitting the base film 10 with the puncher 250. The fixing-pin 270 prevents the base film 10 from being separated from a blanking location in the process of hitting the base film 10 with the puncher 250. An elastic member 275 is provided on a top end of the fixing-pin 270. The elastic member 275 is compressed in a state that the fixing-pin 270 is inserted in the fixing-hole 15 and the pin hole 152 by the descent of the punch unit 200. The elastic member 275 is stretched in a state that the punch unit 200 is raised away from the lower plate 110. The elastic member 275 provides elastic force to the fixing-pin 270 to move the fixing-pin 270 to an initial location after blanking.

The guide column 260 is located under the assistance plate 240 and has a column shape. A top end of the guide column 260 is fixedly joined to the assistance plate 240. A lower portion distal end of the guide column 260 is inserted in the guide hole 141 of the guide bush 140. The guide column 260 is moved along the guide hole 141 according to the descent and the ascent of the upper plate 210. The guide column 260 fixes a relative location of the upper plate 210 with respect to the lower plate 110. Thus, the guide column 260 guides the puncher 250 to accurately hit the base film 10.

Figure 9:
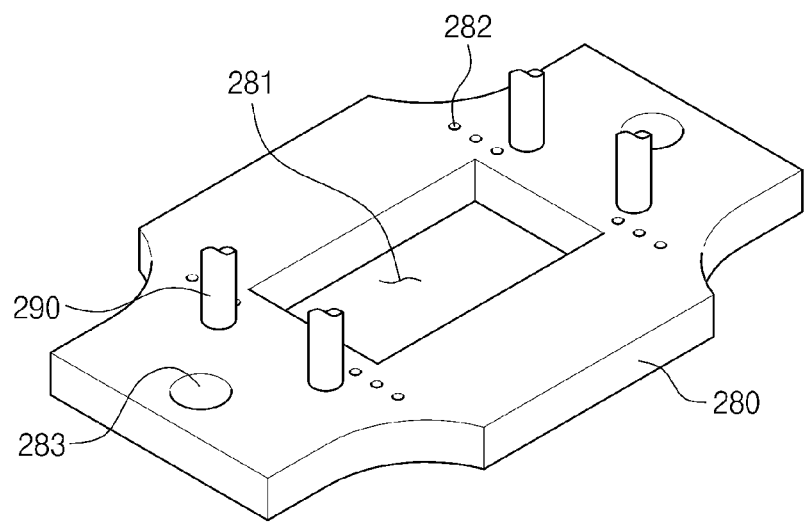
FIG. 9 is a perspective view showing an exemplary embodiment of a stripper of FIG. 6.

The stripper 280 is located between the upper plate 210 and the lower plate 110. FIG. 9 is a perspective view showing an exemplary embodiment of a stripper of FIG. 6. Referring to FIG. 9, the stripper 280 includes an opening 281 in a center region thereof The opening 281 has a shape and a size corresponding to those of a cross section of the puncher 250. The puncher 250 is inserted in the opening 281, and a portion of the puncher 250 is disposed in the opening 281. The stripper 280 includes pin holes 282 in a region adjacent to the opening 281. The pin holes 282 are through holes extending from a top surface of the stripper 280 to a bottom surface of the stripper 280. Locations and the number of the pin holes 282 correspond to the locations and the number of the pin holes 152 of the insert member 150 of FIG. 8, respectively. The fixing-pins 270 are inserted in some of the pin holes 282, and portions of the fixing-pins 270 are located in some of the pin holes 282, respectively. The fixing-pins 270 may be moved to be inserted in others of the pin holes 282. The stripper 280 further includes insertion holes 283 at both end portions of the stripper 280, respectively. The guide columns 260 are received in the insertion holes 283, respectively. Portions of the guide columns 260 are located in the insertion holes 283, respectively.

A support column 290 supports the stripper 280 so that the stripper 280 is located at a predetermined height from the upper plate 210. The top end of the support column 290 is fixed on the assistance plate 240, and a bottom end of the support column 290 is joined to the stripper 280. The support column 290 may be provided in plural. The support columns 290 may be disposed around the puncher 250 in the plan view.

Figure 10:
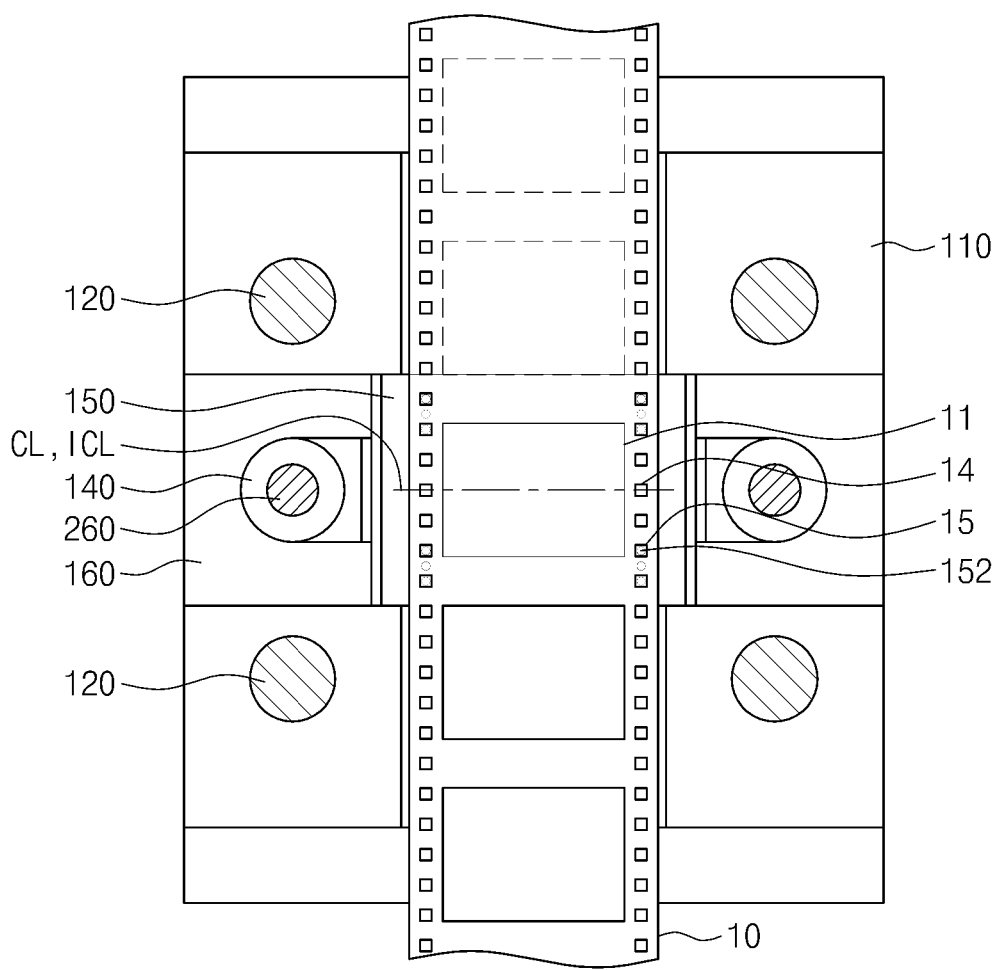
FIG. 10 is a plan view showing an exemplary embodiment of a base film set on a die unit of FIG. 5.
Figure 11:
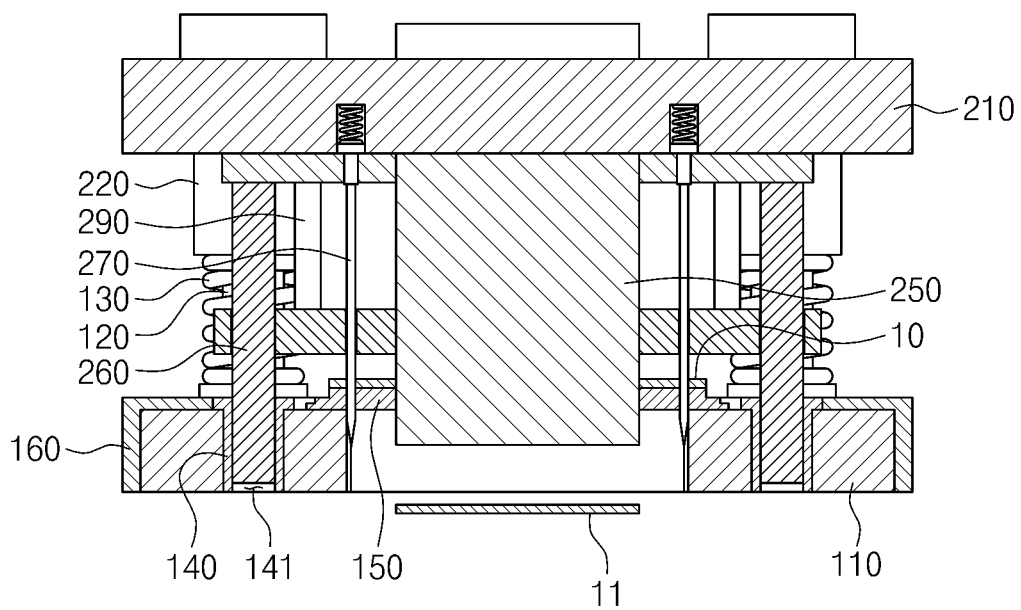
FIG. 11 is a cross-sectional view showing an exemplary embodiment of a process of blanking a printed circuit film with a punch unit.

FIG. 10 is a plan view showing an exemplary embodiment of a base film set on a die unit of FIG. 5 and FIG. 11 is a cross-sectional view showing an exemplary embodiment of a process blanking a printed circuit film with a punch unit.

Referring to FIG. 10, the base film 10 is set on the top surface of the lower plate 110. The printed circuit film 11 for being blanked is set on the top surface of the insert member 150. The center line CL of the printed circuit film 11 is set on a center line ICL of the insert member 150. The reference fixing-holes 14 are located on the center line ICL of the insert member 150. Some of the auxiliary fixing-holes 15 are located to be collinear with some 152 of pin holes in the up-to-down direction, respectively. When the printed circuit film 11 is set on the insert member 150, the punch unit 200 descends. The elevation bush 220 descends along the elevation column 120 by the descent of the upper plate 210, so that the elastic member 130 is compressed. The guide column 260 descends along the guide hole 141 of the guide bush 140. The fixing-pin 270 is sequentially inserted in the auxiliary fixing-hole 15 and the pin hole 152 which are collinear with each other in the up-to-down direction. Thus, the fixing-pin 270 fixes the base film 10 to the insert member 150. The puncher 250 hits the base film 10 and continues in the downward direction, to be inserted in the second opening 151, thereby blanking the printed circuit film 11. The punch unit 200 returns to the initial position before the blanking by the elastic force of the elastic member 130.

Figure 12:
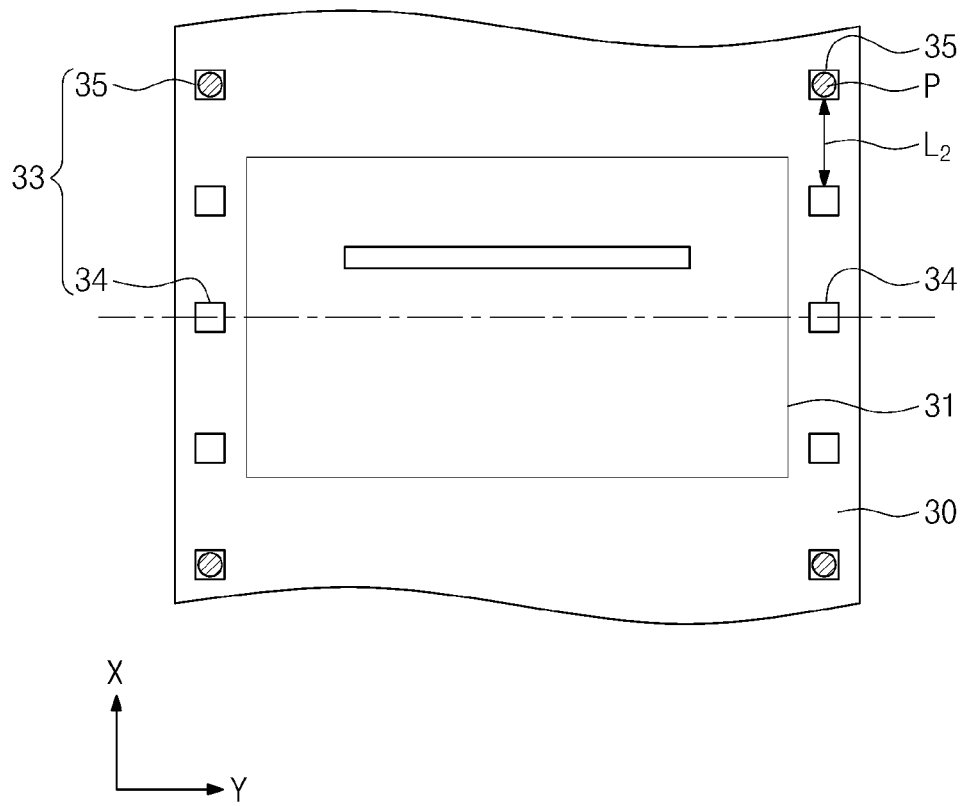
FIGS. 12 and 13 show other exemplary embodiments of base films including printed circuit films according to the invention.

As shown in FIGS. 1 and 12, the space between the fixing-holes 13 of the base film 10 may be changed. The fixing-holes 13 of the base film 10 in FIG. 1 are space apart from each other by a first interval L1, and the fixing-holes 33 of the base film 30 in FIG. 12 are spaced apart from each other by a second interval L2 greater than the first interval L1. If an additional printed circuit film blanking apparatus is provided according to the intervals of the fixing-holes 13 and 33, apparatus cost increases. However, the printed circuit film blanking apparatus 1000 according to embodiments of the invention can blank base films 10 and 30 including the fixing-holes 13 and 33 with the intervals L1 and L2 different from each other by moving the location of the fixing-pins 270.

In one exemplary embodiment, for example, when the base film 10 shown in FIG. 1 is blanked, the fixing-pin 270 is inserted in the pin hole 282 adjacent to the opening 281 of the stripper 280 shown in FIG. 9. The fixing-pin 270 is sequentially inserted in the auxiliary fixing-hole 15 of the base film 10 and the pin hole 152 directly adjacent to the second opening 151 among the pin holes 152 of the insert member 150 shown in FIG. 8. When the base film 30 shown in FIG. 12 is blanked, the fixing-pin 270 is moved to be inserted in the pin hole 282 spaced apart from the opening 281 of the stripper 280 in FIG. 9. The fixing-pin 270 is sequentially inserted in the auxiliary fixing-hole 35 of the base film 30 and the pin hole 152 being spaced apart from the second opening 151 among the pin holes 152 formed in the insert member 150 shown in FIG. 8. As described above, since the location of the fixing-pin 270 in the printed circuit film blanking apparatus 1000 according to embodiments can be changed depending on the intervals of the fixing-holes 13 and 33 formed the base films 10 and 30, the base films 10 and 30 including the fixing holes 13 and 33 of the intervals different from each other can be blanked in one printed circuit film blanking device 1000 according to embodiments of the invention.

Figure 13:
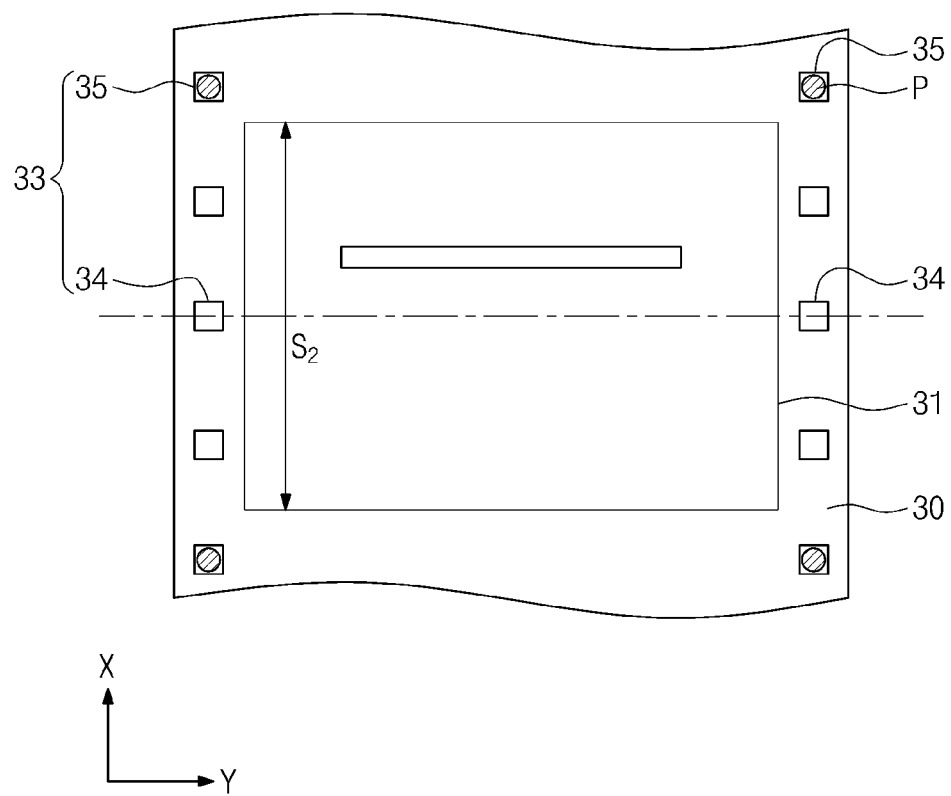

Additionally, as shown in FIGS. 1 and 13, when sizes of printed circuit films 11 and 31 for being blanked are different from each other, the puncher 250 shown in FIG. 7 is replaced to blank the printed circuit film. FIG. 13 illustrates a width S2 of the printed circuit film 31 in a longitudinal direction of the base film 30, larger than a width 51 of the printed circuit film 11 in FIG. 1. The existing puncher 250 used with the base film 10 in FIG. 1, is replaced with another puncher corresponding to a size of the printed circuit film 31 of FIG. 13, and the existing insert member 150 used with the base film 10 in FIG. 1 is replaced with another insert member having an opening corresponding to a cross-sectional area of the replaced puncher 250. Additionally, the fixing-pins 270 are moved to locations corresponding to the fixing-holes 33 of the base film 30 to blank the printed circuit film 31. Thus, even though the size of the printed circuit film is changed, the exemplary embodiment of the printed circuit film blanking apparatus according to the invention can perform the process blanking the printed circuit film having the changed size.

According to embodiments of the invention, since the fixing-holes are arranged using the center line of the printed circuit film as the reference position, the relative locations of the fixing-holes and the printed circuit film can be fixed.

Additionally, according to embodiments of the invention, since the locations of the fixing-pins can move, it is possible that one apparatus can blank printed circuit films having sizes different from each other.

While the invention has been described with reference to exemplary embodiments, it will be apparent to those skilled in the art that various changes and modifications may be made without departing from the spirit and scope of the invention. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. An apparatus for blanking a printed circuit film including a tap integrated circuit from a base film including the printed circuit film, comprising:
   a lower plate;
   an insert member on a top surface of the lower plate and overlapping a hit region of the base film, the hit region defined by dimensions of the printed circuit film, the insert member including defined therein:
      a first opening into which a puncher is inserted, the first opening including first and second sides parallel to a first direction in a longitudinal direction of the base film, and third and fourth sides parallel to a second direction perpendicular to the first direction;
      a plurality of first pin holes at a same side of the first opening in the second direction, the plurality of first pin holes at the same side of the first opening in the second direction defining a group of first pin holes; and
      two groups of first pin holes, each of the groups defined by the plurality of first pin holes at the same side of the first opening in the second direction, the two groups arranged separated from each other along the longitudinal direction of the base film and adjacent to the first opening, a first pin hole within one of the two groups of first pin holes arranged separated from each other along the longitudinal direction of the base film aligned with an auxiliary fixing-hole of the base film;
   an upper plate which overlaps the lower plate and moves toward and away from the lower plate;
   the puncher which protrudes from the upper plate and contacts the hit region of the base film, such that the printed circuit film is separated from the base film; and
   a fixing-pin which protrudes from the upper plate and is inserted in the auxiliary fixing-hole of the base film and in the first pin hole within the one of the two groups of first pin holes arranged separated from each other along the longitudinal direction of the base film aligned with the auxiliary fixing-hole, wherein the fixing-pin fixes a location of the base film with respect to the insert member,
   wherein the printed circuit film includes a first side parallel to the longitudinal direction of the base film, a second side parallel to the first side, a third side perpendicular to the first and second sides, and a fourth side parallel to the third side;
   wherein the puncher separates the printed circuit film along the first to fourth sides; and
   wherein the base film includes:
      a reference fixing-hole which is collinear with a center line of the printed circuit film, the center line at the same distance from the third side and the fourth side of the printed circuit board, and
      a plurality of auxiliary fixing-holes which is separate from the reference fixing-hole at equal intervals along the longitudinal direction of the base film; and
   wherein the fixing-pin is inserted in one of the auxiliary fixing-holes, and
   wherein a number of the groups of the first pin holes corresponds to a number of vertexes of the first opening, and a first pin hole in one of the groups is adjacent to one of the vertexes of the first opening.

2. The apparatus of claim 1, wherein the first pin holes within one of the groups are arranged in the longitudinal direction of the base film.

3. The apparatus of claim 1, further comprising;
   a stripper between the upper plate and the lower plate, and including:
      a second opening into which the puncher is inserted, and
      a plurality of second pin holes which are aligned with the first pin holes of the insert member; and
   a support column which connects the stripper to the upper plate and supports the stripper,
   wherein the fixing-pin selectively aligns with one of the second pin holes of the stripper.

4. The apparatus of claim 3,
   wherein the lower plate includes:
   a third opening aligned with the first opening of the insert member and the second opening of the stripper, and into which the puncher enters after the puncher separates the printed circuit film from the base film; and
   grooves on an inner sidewall at the third opening and aligned with the first pin holes of the insert member.

* * * * *